(12) United States Patent
Frankowsky

(10) Patent No.: US 7,228,473 B2
(45) Date of Patent: Jun. 5, 2007

(54) INTEGRATED MODULE HAVING A PLURALITY OF SEPARATE SUBSTRATES

(75) Inventor: Gerd Frankowsky, Hoehenkirchen (DE)

(73) Assignee: Infineon Technologies AG, Munich (DE)

(*) Notice: Subject to any disclaimer, the term of this patent is extended or adjusted under 35 U.S.C. 154(b) by 253 days.

(21) Appl. No.: 11/090,831

(22) Filed: Mar. 24, 2005

(65) Prior Publication Data
US 2005/0235180 A1    Oct. 20, 2005

(30) Foreign Application Priority Data
Mar. 24, 2004   (DE)   ............. 10 2004 014 242

(51) Int. Cl.
*G01R 31/28*    (2006.01)
(52) U.S. Cl. .......................... 714/724; 714/48
(58) Field of Classification Search ............. 714/726, 714/727, 718, 724, 48; 324/73.1; 257/48
See application file for complete search history.

(56) References Cited

U.S. PATENT DOCUMENTS

| | | | | |
|---|---|---|---|---|
| 4,220,917 A | * | 9/1980 | McMahon, Jr. ............ | 324/555 |
| 4,441,075 A | * | 4/1984 | McMahon .................. | 714/731 |
| 4,504,784 A | * | 3/1985 | Goel et al. ................. | 714/726 |
| 4,509,008 A | * | 4/1985 | DasGupta et al. .......... | 714/731 |
| 4,967,142 A | * | 10/1990 | Sauerwald et al. ......... | 324/73.1 |
| 5,321,277 A | * | 6/1994 | Sparks et al. .............. | 257/48 |
| 5,471,481 A | * | 11/1995 | Okumoto et al. .......... | 714/727 |
| 5,815,001 A | | 9/1998 | Michael | |

FOREIGN PATENT DOCUMENTS

EP    0 733 910 B1    9/1996
WO   WO 02/075926 A2   9/2002

OTHER PUBLICATIONS

German Patent Office Examination Report dated Dec. 23, 2004.

* cited by examiner

*Primary Examiner*—David Ton
(74) *Attorney, Agent, or Firm*—Patterson & Sheridan, L.L.P.

(57) ABSTRACT

The invention relates to a module having a first integrated circuit and a second integrated circuit which are arranged on separate substrates, having a first output terminal and a second output terminal to which the first and second integrated circuits are respectfully connected in a parallel manner, and having a first selection terminal and a second selection terminal which are mutually separate and are connected to the first and second integrated circuits, respectively. A test circuit is provided in each of the integrated circuits to generate an error signal depending on whether an error occurred during a test operation, and an output circuit is provided in each of the integrated circuits to select the first output terminal or the second output terminal, depending on a selection signal that is applied to the respective selection terminal, for the purpose of outputting a state that indicates the error.

20 Claims, 3 Drawing Sheets

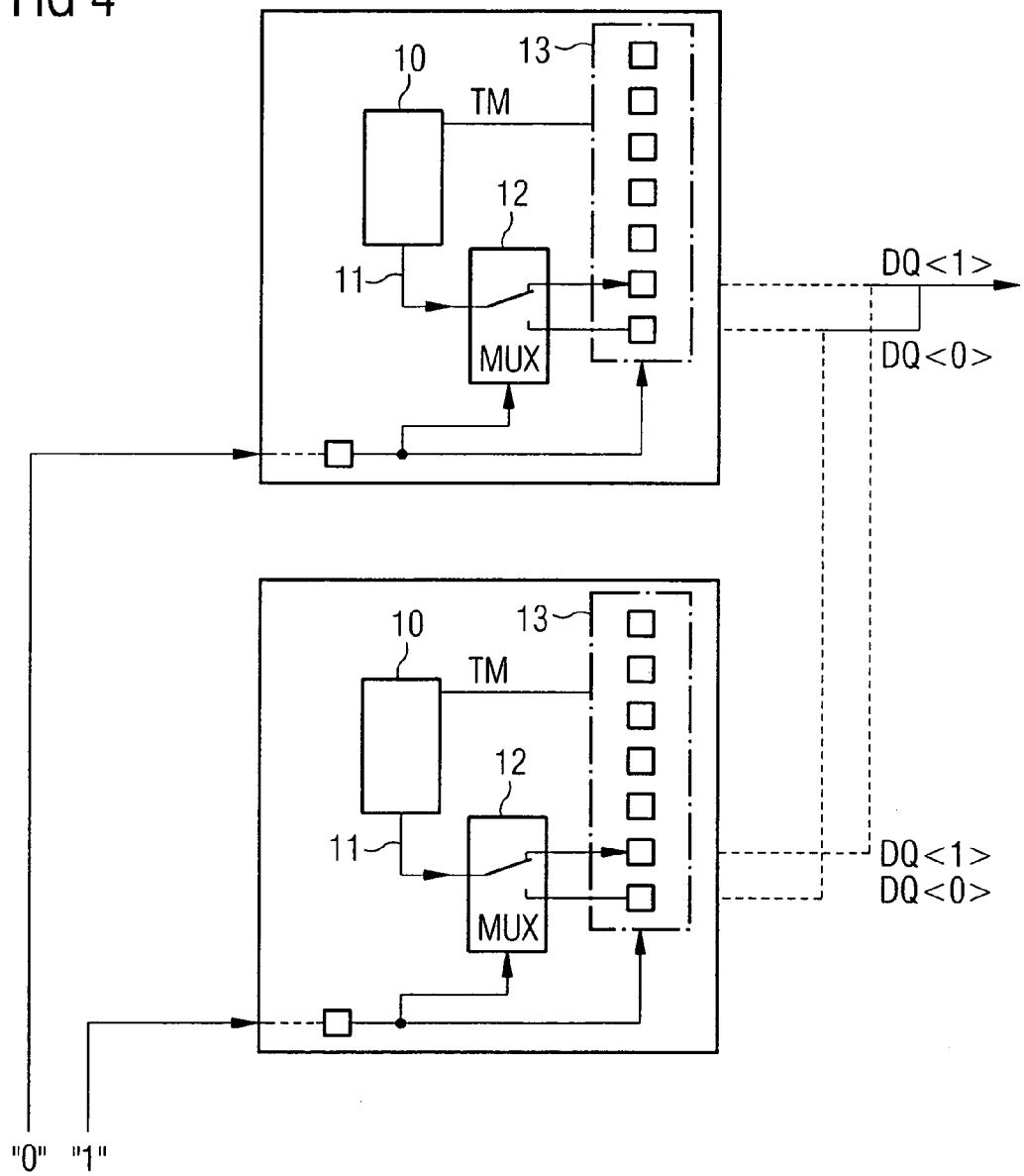

INTEGRATED MODULE HAVING A PLURALITY OF SEPARATE SUBSTRATES

CROSS-REFERENCE TO RELATED APPLICATIONS

This application claims foreign priority benefits under 35 U.S.C. §119 to co-pending German patent application number DE 10 2004 014 242.4-35, filed 24 Mar. 2004. This related patent application is herein incorporated by reference in its entirety.

BACKGROUND OF THE INVENTION

1. Field of the Invention

The invention relates to an integrated module having a first and a second integrated circuit which are arranged on separate substrates. The invention furthermore relates to a tester system for testing such an integrated module and to a method for driving a first and a second output terminal of such an integrated module.

2. Description of the Related Art

In order to provide powerful modules, more than one substrate (die) having an integrated circuit may be inserted into a housing and may be connected to external terminals of the module using common or mutually separate bonding wires and the like. The substrates having the integrated circuits are usually stacked and inserted into such a module. In this case, the terminals of the individual integrated circuits are connected to one another and to an external terminal in accordance with their function.

To drive the individual integrated circuits separately, some of the terminals are not connected to one another and are routed directly to individual mutually separate output terminals. The individual integrated circuits are assembled and installed in the finished module after the wafer test and maybe even after the circuits have been repaired. After assembly, however, the module's operation must be tested again.

Such modules having a plurality of individual integrated circuits have hitherto been tested in the same way as a module having only one integrated circuit. That is to say, in the case of memory circuits, two 256 megabit circuits, for example, are treated and tested like one 512 megabit module. The test time required thus corresponds approximately to the test time of a 512 megabit memory circuit.

SUMMARY OF THE INVENTION

One embodiment of the present invention provides an integrated module having a plurality of integrated circuits which are arranged on separate substrates in which the module may be tested in a more rapid manner. Furthermore, another embodiment of the present invention provides a method for driving output terminals of an integrated module which results in accelerated testing of the integrated module.

In accordance with a first aspect of the present invention, an integrated module includes a first integrated circuit and a second integrated circuit which are arranged on mutually separate substrates. The integrated module has a first output terminal and a second output terminal to which the first integrated circuit and the second integrated circuit, respectively, are connected in a parallel manner. A first selection terminal and a second selection terminal which are mutually separate are connected to the first and second integrated circuits, respectively. A test circuit is provided in each of the integrated circuits to generate an error signal in a manner dependent on an error that occurred during a test operation. An output circuit is provided in each of the integrated circuits to select the first output terminal or the second output terminal, in a manner dependent on a selection signal that is applied to the selection terminal, for the purpose of outputting a state that indicates the error.

Thus, an integrated module having a plurality of integrated circuits may be tested in such a manner that, as a result of the test circuit, an internal test operation takes place in parallel in the integrated circuits of the module, and that the respective error signal may be output, as a signal that indicates the error, at two different output terminals of the integrated module. A connected tester device drives each of the integrated circuits simultaneously and initiates the test operation. Different signals are applied to the first selection terminal and the second selection terminal, with the result that one of the integrated circuits outputs the signal that indicates errors at the first output terminal and the other integrated circuit outputs the signal that indicates errors at the second output terminal, or vice versa. By reading the two output terminals, the tester device can thus establish whether, and in which of the integrated circuits of the tested module, an error has occurred.

In a manner dependent on the respective error signal, the output circuit may switch the selected output terminal to high impedance if the error signal does not indicate an error and sets the selected output terminal to a predetermined state if the error signal indicates an error. The respective output terminal may be connected to further output terminals of the same or other integrated modules to OR the signals which are applied to the output terminals which have been connected in this manner (e.g., connect the output terminals to an OR gate).

In particular, the first output terminal and the second output terminal may be connected to one another and, via a tester line, to a test device that monitors the test operation. In this case, a test is carried out merely to determine whether or not the integrated module has an error, wherein it may be irrelevant which of the integrated circuits in the integrated module contains the error. This is useful when the integrated module having an existing error cannot be repaired since it has already been housed and is no longer suitable for subsequent use.

In particular, at least one of the output circuits may have a multiplexer to pass the error signal to the first or second output terminal.

Each of the output circuits may have a respective output driver for the respective first and second output terminals, the output driver of the respective output terminal being configured such that it switches the selected output terminal, when selected by means of the selection signal, to high impedance or to the predetermined state in a manner dependent on the error signal.

In accordance with a further embodiment, the respective output circuit may be configured such that it switches the output terminal which has respectively not been selected to high impedance.

In accordance with a further aspect of the present invention, an integrated circuit for use in such an integrated module is provided.

In accordance with a further aspect of the present invention, a test system is provided to test an integrated module and has a tester device that is connected via a tester channel. The first output terminal and the second output terminal of the integrated module are connected to one another and to the tester device via the tester channel.

A further aspect of the present invention provides a method for driving a first output terminal and a second output terminal of an integrated module having a first integrated circuit and a second integrated circuit which are arranged on mutually separate substrates. The first and second integrated circuits are connected to the output terminals in a parallel manner. A first selection terminal and a second selection terminal are provided as individual terminals for the purpose of selecting the first and second integrated circuits, the selection terminals being mutually separate. An error signal is generated in each of the integrated circuits in a manner dependent on an error that occurred during a test operation. In each of the integrated circuits, the first output terminal or the second output terminal is selected, in a manner dependent on a selection signal that is applied to the respective selection terminal, for the purpose of outputting a state that indicates the error.

A test method for an integrated module having a plurality of integrated circuits may be implemented using such a method for driving the output terminals of an integrated module. The test method may be carried out in a more rapid manner than the test methods which are conventionally carried out since the integrated circuits of the module are tested in parallel with one another and the respective errors are output at different output terminals of the module.

The selected output terminal may be switched to high impedance if the error signal does not indicate an error and may be set to a predetermined state if the error signal indicates an error.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 shows a diagrammatic illustration of a module according to one embodiment of the invention having two integrated circuits which are connected to a tester device for testing purposes.

DETAILED DESCRIPTION OF THE PREFERRED EMBODIMENT

Figure 1A:
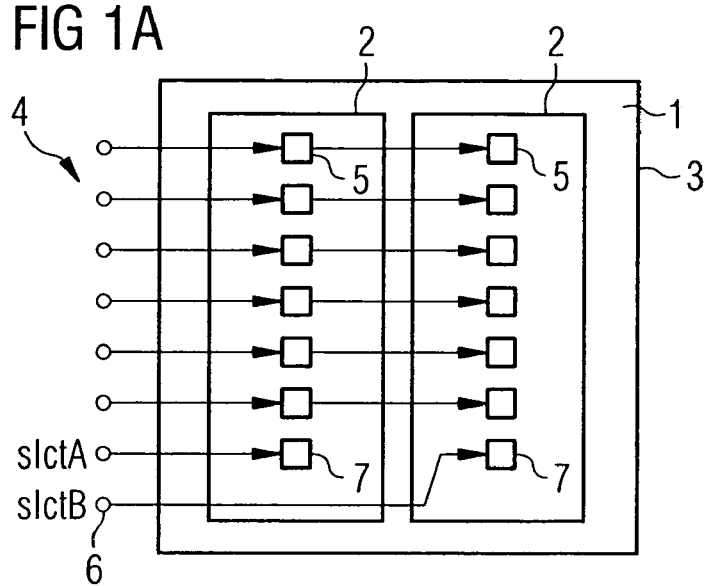
FIGS. 1a and 1b show diagrammatic illustrations of an integrated module having a plurality of integrated circuits.

FIG. 1a diagrammatically illustrates a module 1 having two integrated circuits 2 arranged therein. The module 1 has a housing 3 in which the integrated circuits 2 are stacked next to one another, above one another or are arranged in some other way with respect to one another. The module 1 has output terminals 4 which can be used to externally contact-connect the module.

In particular, the memory modules may contain a plurality of integrated memory circuits to increase the amount of storage provided in the module. The amount of storage may be a multiple of the memory size that is typically available in an integrated circuit. The integrated circuits present in the module 1 are preferably identical and their respective contact terminals 5 are connected to the output terminals 4 in such a manner that each respective output terminal 4 is simultaneously connected to the respective contact terminals of the integrated circuits having the same function.

To drive the integrated circuits 2 separately during normal operation, selection terminals 6 (e.g., slctA and slctB) are provided on the module 1. The number of selection terminals 6 generally correspond to the number of integrated circuits present in the module 1. By way of example, one of the integrated circuits may thus be selected by applying a high signal to the respective selection input that is connected to the integrated circuit 2 to be selected, while a low signal is applied to all other selection terminals 6. The respective selection terminal 6 for each of the integrated circuits is connected to a respective selection input 7 of the integrated circuit 2 and may, for example, be connected to a chip select input of the integrated circuit 2 or to an address input of the integrated circuit 2.

In particular, if the integrated circuits comprise memory circuits, the selection terminal may be connected to an address input of the respective integrated circuit.

Figure 1B:
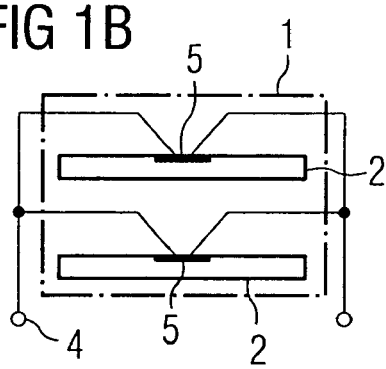

FIG. 1b illustrates a cross section through a stack arrangement of the integrated circuits 2 in the module 1 according to one embodiment of the invention. As shown, the contact-connection terminals 5 which, in terms of their function, correspond to one another are connected to one another and to one of the output terminals 4. If the integrated circuits are structurally identical, the contact terminals 5 are at the same position on the integrated circuit 2, with the result that, depending on the arrangement of the contact terminals 5, the mutually corresponding contact-connection terminals 5 may be connected utilizing flip-chip technology.

Figure 2:
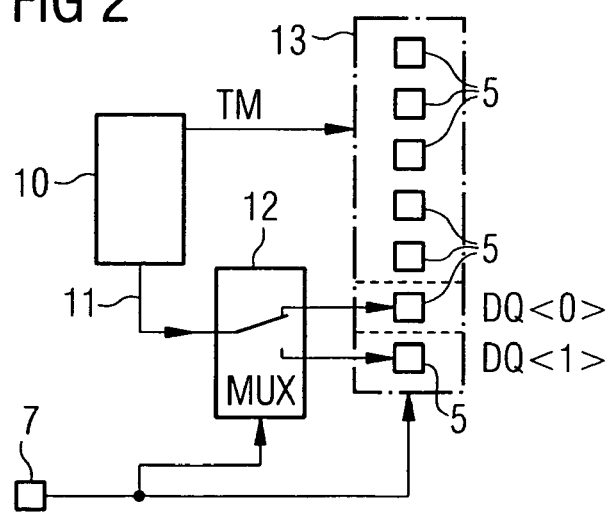
FIG. 2 shows a diagrammatic illustration of one of the integrated circuits in the module.

FIG. 2 illustrates, as a detail, part of one of the integrated circuits 2 whose contact terminals 5 and selection input 7 are connected to the corresponding output terminals 4 and the selection terminal 6, respectively, of the module 1. The contact terminals 5 may be provided for the purpose of receiving address signals, control signals and data signals. Two of the contact terminals DQ0, DQ1 are selected to indicate, during a test operation, whether an error has occurred during the test operation. The selected contact terminals 5 are usually data inputs/outputs for receiving and, respectively, outputting data signals. Depending on whether the integrated circuit 2 is in a test mode or in a normal mode, the two contact terminals DQ0, DQ1 are therefore used either to read-in or output data in a normal manner or to output error data.

The switching of the inputs/outputs may be controlled by a test circuit 10. The test circuit 10 is connected to a functional circuit of the integrated circuit (not shown) and automatically controls large parts of the test operation and, depending on whether an error has occurred, generates a signal (i.e., an error signal) that indicates or does not indicate an error. The error signal is supplied, via the error signal line 11, to a multiplexer 12 that passes the error signal, via a respective output driver 13, either to the first contact terminal DQ0 or to the second contact-connection terminal DQ1. The output drivers 13 can be controlled in such a manner that, during normal operation, the data to be driven out of the circuit are amplified and the data to be read-in are received. To this end, the output drivers 13 are connected to the test circuit 10, with the result that the output driver 13 is provided with a test mode signal TM that indicates whether the integrated circuit is in the normal mode or in a test mode.

The selection signal that is made available to the module at the respective selection terminal 6 is applied to the selection input 7 of the integrated circuit. The selection signal is made available to the multiplexer 12 which, depending on the level of the selection signal, forwards the error signal on the error signal line 11 either to the first contact terminal DQ0 or to the second contact terminal DQ1. The selection signal is likewise forwarded to the output drivers 13. The output drivers 13 are connected in such a manner that that contact terminal of the first and second contact terminals DQ0, DQ1 which is not addressed by the multiplexer 12 is deactivated in such a manner that it is switched to high impedance. In a manner dependent on the error signal, that contact terminal to which the error signal is forwarded is either switched to high impedance if the error signal indicates that an error has not occurred or is set to a particular state, for example, a high level, if the error signal indicates that an error has occurred.

Figure 3:
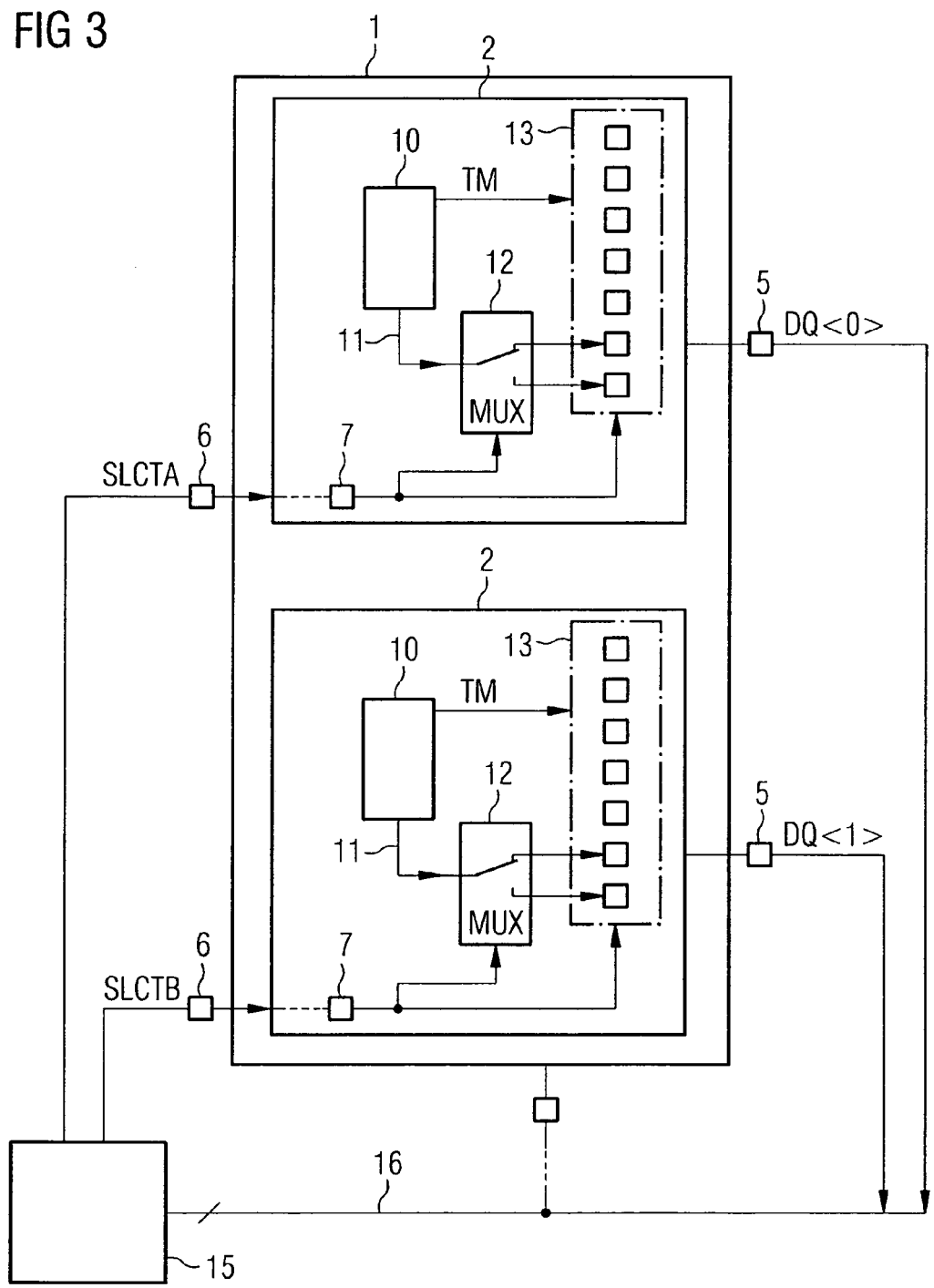
FIG. 3 shows an illustration of the module having two integrated circuits (as shown in FIG. 2) which are connected to a tester device for testing purposes.

FIG. 3 illustrates a module according to one embodiment of the invention containing two integrated circuits 2. The selection inputs 7 of the integrated circuits 2 are connected to the respective selection terminals 6 (designated SLCTA, SLCTB) of the module 1. When testing the module 1, a tester device 15 provides the selection signals at the selection terminals 6. The tester device 15 is furthermore connected, via tester channels 16, to the output terminals 5, in particular to the first and second output terminals DQ0, DQ1, which are used to indicate whether an error has occurred.

When testing the module, the tester device 15 applies, for example, a low level to the first selection terminal SLCTA and a high level to the second selection terminal SLCTB. In addition, the tester device 15 transmits address data, control data and/or test data to the integrated circuits to carry out the test operation in the integrated circuits. The integrated circuits carry out the test operation in parallel in the two integrated circuits 2, irrespective of the selection signal that is applied to the selection input 7. After the respective test operation has ended, an error data item that indicates whether an error has occurred in the respective integrated circuit is available on the respective error signal line 11 of each integrated circuit 2. By way of example, the corresponding error data item uses a high level to indicate that an error has occurred and uses a low level to indicate that an error has not occurred.

The error data are output, via the multiplexers 12, to either the first or the second contact terminal DQ0, DQ1 of the respective integrated circuit 2. The multiplexer 12 is connected to the selection signal, with the result that the selection signal is used to select the contact terminal DQ0, DQ1 to which the respective error signal is passed.

The error signals are received by the output drivers 13 for the respective contact terminal The state of the respective output driver 13 that is assigned to the contact terminal may be set, during the test mode, in a manner dependent on the state of the error signal. If the error signal indicates that an error has not occurred, the selected contact terminal is switched to high impedance, and, if the error signal indicates that an error has occurred, the selected contact terminal DQ0, DQ1 is set to a particular state, for example, a high level. Connecting the first and the second contact terminal to the tester device 15 via the tester channel makes it possible to read out the states of the respective contact terminal DQ0, DQ1, with the result that it is possible to check whether an error has occurred in the first or in the second integrated circuit.

In principle, it is not necessary to switch the contact terminal to high impedance since it is also possible to communicate the fact that an error has not occurred to the tester device via a further logic state.

However, FIG. 4 illustrates an embodiment in which the first and second data outputs of the two integrated circuits 2 are connected to one another and are connected to the tester device 15 via a single tester channel. It may be sufficient, when testing the finished module, to detect the occurrence of an error without determining the type of error or the location at which the error has occurred. In the embodiment illustrated in FIG. 4, the contact terminals may be switched likewise, which have respectively not been selected by the multiplexer 12, to high impedance. If an error does not now occur in both of the integrated circuits 2, all of the first and second contact terminals DQ0, DQ1 have a high impedance and there is no signal on the tester channel. The tester device interprets this to mean that an error has not occurred.

If an error is now detected in one of the integrated circuits, the selected contact terminal DQ0, DQ1 is set to the particular state, for example, to a particular potential. This potential indicates to the tester device 15 that an error has occurred within the module. Since the other data outputs have respectively been switched to high impedance, the signal that indicates the error is not distorted or influenced in another manner.

The provision of such an output circuit in the integrated circuits for a module that combines a plurality of integrated circuits on different substrates is expedient, in particular, in structurally identical circuits, and more particularly, in structurally identical memory circuits. Because the output via which the error is indicated is prescribed by the external tester device during the test operation, the outlay may be reduced when fabricating such a module since identical integrated circuits may be used. This considerably simplifies the logistics during production.

The module and the method described are not restricted to only two integrated circuits being situated in the module. It is contemplated that more than two integrated circuits to be provided in the module and tested in parallel.

While the foregoing is directed to embodiments of the present invention, other and further embodiments of the invention may be devised without departing from the basic scope thereof, and the scope thereof is determined by the claims that follow.

What is claimed is:

1. A module, comprising:
   a first integrated circuit and a second integrated circuit disposed on separate substrates;
   a first output terminal and a second output terminal connected to the first and second integrated circuits respectfully in parallel;
   a first selection terminal and a second selection terminal which are separate and are connected to the first and second integrated circuits, respectively;
   for each integrated circuit:
   a test circuit for generating an error signal indicating whether an error occurred during a test operation; and
   an output circuit which selects one of the first output terminal and the second output terminal depending on a selection signal that is applied to the respective selection terminal, for outputting a state indicating that the error occurred.

2. The module of claim 1, wherein, depending on the error signal, the output circuit switches the selected output terminal to a high impedance when the error signal does not indicate that the error occurred.

3. The module of claim 2, wherein, depending on the error signal, the output circuit sets the selected output terminal to a predetermined state when the error signal indicates that the error occurred.

4. The module of claim 3, wherein at least one output circuit includes a multiplexer connected to pass the error signal selectively to one of the first and second output terminals.

5. The module of claim 4, wherein each output circuit includes a respective output driver for the first and second output terminals, the output driver of the respective output terminal being configured to switch the selected output terminal, when selected by the selection signal, to one of the high impedance and the predetermined state depending on the error signal.

6. The module of claim 5, wherein the output circuit is configured to switch the respective output terminal which has not been selected to high impedance.

7. The module of claim 1, wherein the integrated circuits are arranged in stacked form in the module.

8. The module of claim 1, wherein the integrated circuits are identical.

9. An integrated circuit, comprising:
   a test circuit for generating an error signal indicating whether an error occurred during a test operation;
   a first output terminal and a second output terminal for outputting a state indicating whether the error occurred, wherein the first and second output terminals are connectable in parallel respectively to respective output terminals of one or more other integrated circuits;
   a selection input for receiving a selection signal;
   an output circuit which selects one of the first output terminal and the second output terminal depending on the selection signal.

10. A test system, comprising:
    an integrated module comprising:
      a first integrated circuit and a second integrated circuit disposed on separate substrates;
      a first output terminal and a second output terminal connected to the first and second integrated circuits respectfully in parallel; and
      a first selection terminal and a second selection terminal which are separate and are connected to the first and second integrated circuits, respectively;
      for each integrated circuit:
        a test circuit for generating an error signal indicating whether an error occurred during a test operation; and
        an output circuit which selects one of the first output terminal and the second output terminal depending on a selection signal that is applied to the respective selection terminal, for outputting a state indicating that the error occurred; and
    a tester device connected via a tester channel to the first and second output terminals of the integrated module, wherein the first and second output terminals of the integrated module are connected to one another and to the tester device via the tester channel.

11. The module of claim 10, wherein, depending on the error signal, the output circuit switches the selected output terminal to a high impedance when the error signal does not indicate that the error occurred and sets the selected output terminal to a predetermined state when the error signal indicates that the error occurred.

12. The test system of claim 11, wherein at least one output circuit includes a multiplexer connected to pass the error signal selectively to one of the first and second output terminals.

13. The test system of claim 12, wherein each output circuit includes a respective output driver for the first and second output terminals, the output driver of the respective output terminal being configured to switch the selected output terminal, when selected by the selection signal, to one of the high impedance and the predetermined state depending on the error signal.

14. The test system of claim 13, wherein the output circuit is configured to switch the respective output terminal which has not been selected to high impedance.

15. The test system of claim 10, wherein the integrated circuits are arranged in stacked form in the module.

16. The test system of claim 10, wherein the integrated circuits are identical.

17. A method for testing integrated circuits, comprising:
    providing an integrated module having a first integrated circuit and a second integrated circuit disposed on separate substrates, and having a first output terminal and a second output terminal of the first and second integrated circuits, respectively, wherein the first and second integrated circuit are connected to the output terminals in a parallel manner, comprising:
    generating an error signal for each integrated circuit depending on whether an error occurred during a test operation;
    providing a selection signal to a first terminal and a second selection terminal of the integrated module for selecting one of the first and second integrated circuits, wherein the selection terminals are separate; and
    selecting, in each integrated circuit, one of the first output terminal and the second output terminal depending on the selection signal that is applied to the respective selection terminal, to output a state for indicating the error.

18. The method of claim 17, wherein the selected output terminal is switched to high impedance when the error signal does not indicate that the error occurred and is set to a predetermined state when the error signal indicates that the error occurred.

19. The method of claim 18, wherein the respective output terminal that has not been selected is switched to high impedance.

20. The method of claim 17, wherein the error signal is selectively passed to one of the first and second output terminals via a multiplexer disposed in at least one output circuit.

* * * * *